United States Patent
Abughazaleh

(10) Patent No.: US 7,541,652 B1
(45) Date of Patent: Jun. 2, 2009

(54) SUBSTRATE COUPLED NOISE ISOLATION FOR INTEGRATED CIRCUITS

(75) Inventor: Firas N. Abughazaleh, Austin, TX (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 10/839,932

(22) Filed: May 5, 2004

(51) Int. Cl.
*H01L 29/72* (2006.01)

(52) U.S. Cl. ............... 257/372; 257/373; 257/401; 257/500; 257/528; 257/544

(58) Field of Classification Search ........... 257/372, 257/373, 401, 500, 528, 544
See application file for complete search history.

(56) References Cited

U.S. PATENT DOCUMENTS

2001/0038138 A1* 11/2001 Miles et al. ............... 257/544
2002/0164851 A1* 11/2002 Wu et al. ................... 438/215

OTHER PUBLICATIONS

Aragones, Xavier et al., "Analysis ans Solutions for Switching Noise Coupling in Mixed-Signal ICs", Chapter 2, pp. 10-11, 20-25, 36-47 and Chapter 4 pp. 70-86, Kluwer Academic Publishers, Springer; 1st edition (Apr. 30, 1999).*
U.S. Appl. No. 10/683,944, filed Oct. 10, 2003, Young.
Charbon, Edoardo et al., "Substrate Noise Analysis and Optimization for IC Design," 2001, Chapter 8, pp. 99-133, available from Kluwer Academic Publishers, 101 Philip Drive, Assinippi Park, Norwell, Massachusetts 02061.
Aragones, Xavier et al., entitled "Analysis and Solutions for Switching Noise Coupling in Mixed-Signal ICs", Chapter 2, pp. 10-11, 20-25, 36-47 and Chapter 4 pp. 70-86, Kluwer Academic Publishers, Springer; 1st edition (Apr. 30, 1999) ISBN-10: 0792385047, ISBN-13: 978-0792385042.

* cited by examiner

*Primary Examiner*—Edward Wojciechowicz
(74) *Attorney, Agent, or Firm*—Timothy W. Markison; John J. King

(57) ABSTRACT

An integrated circuit includes a substrate, a noise sensitive circuit, and a first low impedance guard ring. The substrate includes a well-doped blocking ring that at least partially surrounds the noise sensitive circuit. The noise sensitive circuit is fabricated on the substrate. The first low impedance guard ring is fabricated on the substrate to at least partially surround the well-doped blocking ring, wherein the first low impedance guard ring is operably coupled to a first circuit ground, wherein impedance of the first low impedance guard ring is substantially less than impedance of the well-doped blocking ring.

20 Claims, 11 Drawing Sheets

Prior Art N-channel transistor programmable logic device 10

MGT 20

IC 50

IC 50

IC 50

IC 50 cross section of FIG. 5 cross section of FIG. 7 cross section of FIG. 4 cross section of FIG. 6 ions # US 7,541,652 B1

SUBSTRATE COUPLED NOISE ISOLATION FOR INTEGRATED CIRCUITS

BACKGROUND OF THE INVENTION

1. Technical Field of the Invention

This invention relates generally to integrated circuits and more particularly to reducing substrate noise coupling.

2. Description of Related Art

FIG. 1 is a cross-sectional view of a prior art N-channel transistor fabricated on a substrate. As shown, the N-channel transistor includes two N-doped implants to produce a source and drain. The N-channel transistor further includes a gate and a P-doped implant that functions as a guard ring. To activate the N-channel transistor, a voltage VDS is provided to the drain and a voltage VGS is provided to the gate.

In many applications, the N-channel transistor may be used in noise sensitive circuitry such as amplifiers, buffers, analog-to-digital converters, et cetera. As is often the case, an integrated circuit has millions of transistors on its substrate, some of which are used in digital circuitry that produces noise, which is coupled into the substrate.

In the illustration of FIG. 1, a portion of a transistor (e.g., a gate and drain) that may be used in digital circuitry is shown on the substrate. The transistor within the digital circuitry is switched on and off using, for example, 1-volt VGS voltage, which produces a varying voltage between the supply voltage and AC or DC ground at the transistor's drain. Such a varying voltage produces an AC voltage gradient with respect to the guard ring of the transistor used in the noise sensitive circuit. The gradient is represented by the thin dashed lines.

The substrate may include different regions as shown. For example, one region may be a P-doped region that has a relatively low resistivity (for example, 0.1 OHMS-centimeter) and a lightly doped P-region which has a higher resistivity (e.g., 20 OHMS-centimeter). Due to the voltage gradient and the impedance of the P-doped region, AC noise voltage couples from various terminals (e.g., drain and/or gate) of the transistor in the noise generating circuit to various terminals (e.g., drain and/or gate) of transistor of the noise sensitive circuit.

In particular, the substrate coupled noise causes the voltage of the drain and/or gate of the transistor of the noise sensitive circuit to vary, which alters its operating point. As such, the substrate coupled noise modulates the signals being processed by the transistor as is desired function within the noise sensitive circuit causing adverse affects on the overall performance of the noise sensitive circuit.

Therefore, a need exists for isolating substrate coupled noise within integrated circuits.

BRIEF SUMMARY OF THE INVENTION

The substrate coupled noise isolation within integrated circuit of the present invention substantially meets these needs and others. In one embodiment, an integrated circuit includes a substrate, a noise sensitive circuit, and a first low impedance guard ring. The substrate includes a well-doped blocking ring that at least partially surrounds the noise sensitive circuit. The noise sensitive circuit is fabricated on the substrate. The first low impedance guard ring is fabricated on the substrate to at least partially surround the well-doped blocking ring, wherein the first low impedance guard ring is operably coupled to a first circuit ground, wherein impedance of the first low impedance guard ring is substantially less than impedance of the well-doped blocking ring.

In another embodiment, a serializer/deserializer (SER-DES) module includes a Serial-Input-Parallel-Output (SIPO) module, a Parallel-Input-Serial-Output (PISO) module, a first well-doped blocking ring, a second well-doped blocking ring, a first low impedance guard ring, and a second low impedance guard ring. The SIPO module converts inbound high-speed serial data into inbound parallel data, wherein the SIPO module includes a first noise sensitive circuit and wherein the SIPO module is fabricated on a substrate of an integrated circuit. The PISO module converts outbound parallel data into high-speed outbound serial data, wherein the PISO module includes a second noise sensitive circuit and wherein the PISO module is fabricated on the substrate of the integrated circuit. The first well-doped blocking ring is fabricated on the substrate to at least partially surround the first noise sensitive circuit. The second well-doped blocking ring is fabricated on the substrate to at least partially surround the second noise sensitive circuit. The first low impedance guard ring is fabricated on the substrate to at least partially surround the first well-doped blocking ring, wherein the first low impedance guard ring is operably coupled to a first circuit ground and wherein impedance of the first low impedance guard ring is substantially less than impedance of the first well-doped blocking ring. The second low impedance guard ring is fabricated on the substrate to at least partially surround the second well-doped blocking ring, wherein the second low impedance guard ring is operably coupled to a second circuit ground and wherein impedance of the second low impedance guard ring is substantially less than impedance of the second well-doped blocking ring.

In yet another embodiment, a field programmable gate array (FPGA) includes programmable logic fabric, a multi-gigabit transceiver (MGT), a first well-doped blocking ring, and a first low impedance guard ring. The programmable logic fabric is fabricated on a substrate of an integrated circuit. In some embodiments, the FPGA may include a digital clock manager (DCM) that generates at least one clock signal, wherein the DCM is fabricated on the substrate. The MGT transmits and receives high-speed data, wherein the MGT is fabricated on the substrate and includes noise sensitive circuitry. The first well-doped blocking ring is fabricated on the substrate to at least partially surround the noise sensitive circuitry. The first low impedance guard ring is fabricated on the substrate to at least partially surround the first well-doped blocking ring, wherein the first low impedance ring is operably coupled to a first circuit ground and wherein an impedance of the first low impedance guard ring is substantially less than the impedance of the first well-doped guard ring.

DETAILED DESCRIPTION OF THE INVENTION

Figure 1:
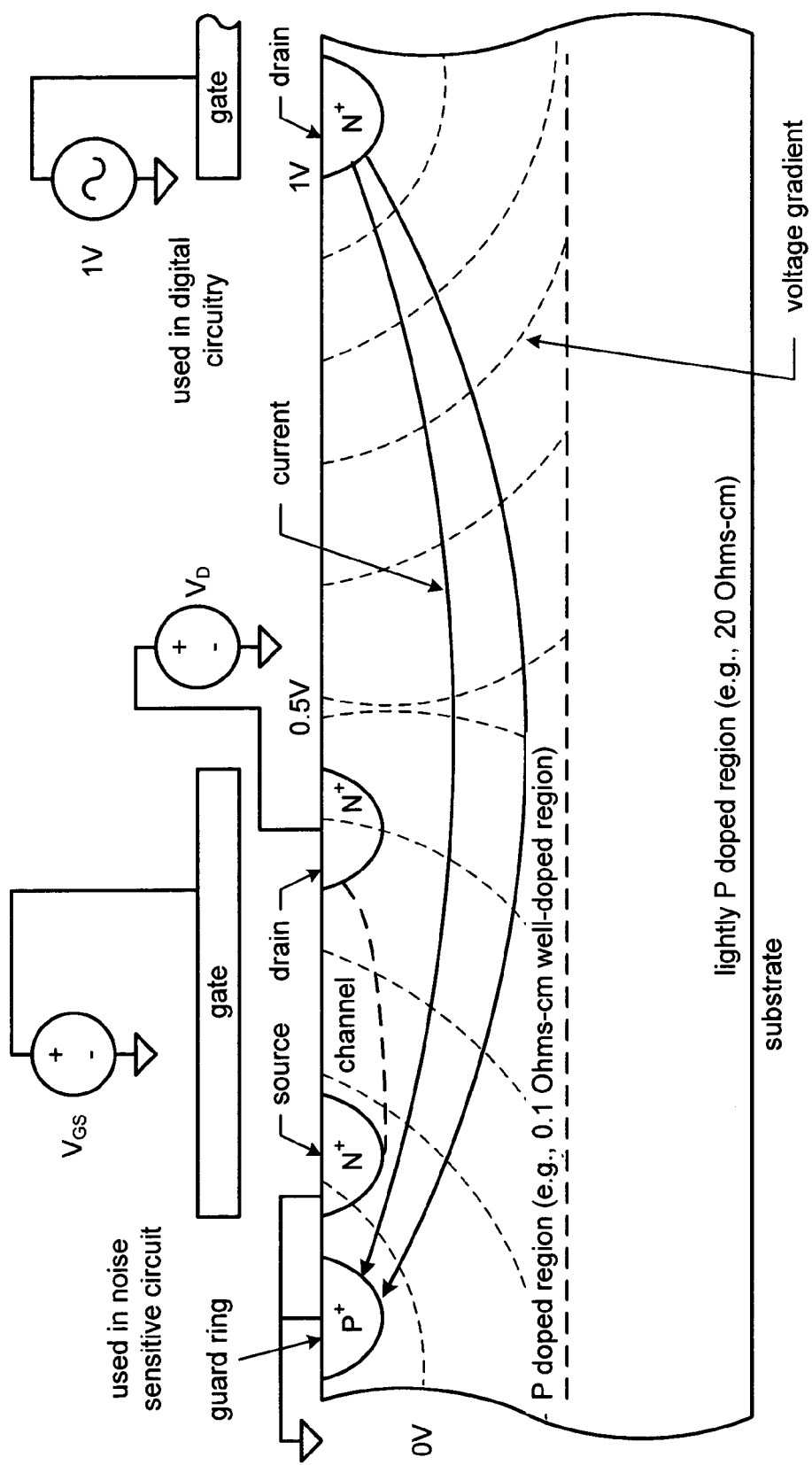
FIG. 1 is a cross-sectional diagram of a prior art N-channel transistor.
Figure 2:
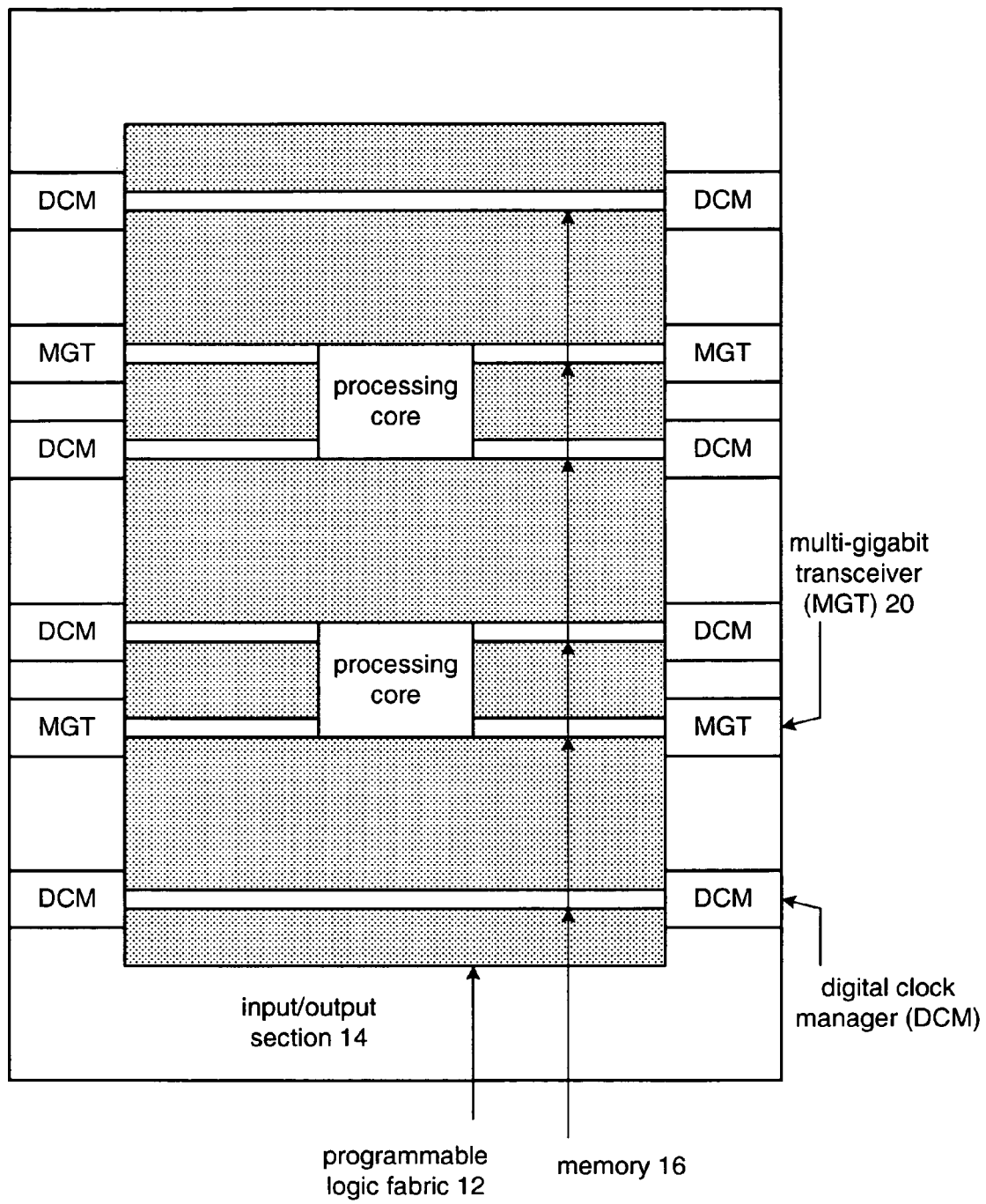
FIG. 2 is a schematic block diagram of a programmable logic device in accordance with the present invention.

FIG. 2 is a schematic block diagram of a programmable logic device 10 that includes programmable logic fabric 12, an input/output section 14, and memory 16. The programmable logic fabric 12 may include one or more processing cores and programmable logic circuitry. Such programmable logic circuitry may include programmable logic arrays (PLAs), programmable array logic (PAL) devices, erasable programmable logic devices (EPLDs) and/or programmable gate arrays (PGAs). Memory 16 may be block random access memory (BRAM). Input/output section 14 may include a plurality of digital clock managers (DCMs) and a plurality of multi-gigabit transceivers (MGTs). An alternative embodiment of a programmable logic device may be found in U.S. patent application Ser. No. 10/683,944 by Young, which is incorporated herein in its entirety.

The digital clock managers provide various clock signals to the programmable logic fabric 12 and may further provide clock signals to the multi-gigabit transceivers. The multi-gigabit transceivers provide digital interfaces for the programmable logic fabric 12 to exchange data with components external to the programmable logic device 10. In general, the multi-gigabit transceivers provide serial-to-parallel conversion of received serial data and provide parallel-to-serial conversion for outgoing data. The MGTs may include signal detection circuitry to detect the presence of the received serial data and to enable the receiver section within the MGT. Further, the digital clock managers may provide clock signals to memory, or other input/output modules, for double data rate and quad data rate accesses.

Figure 3:
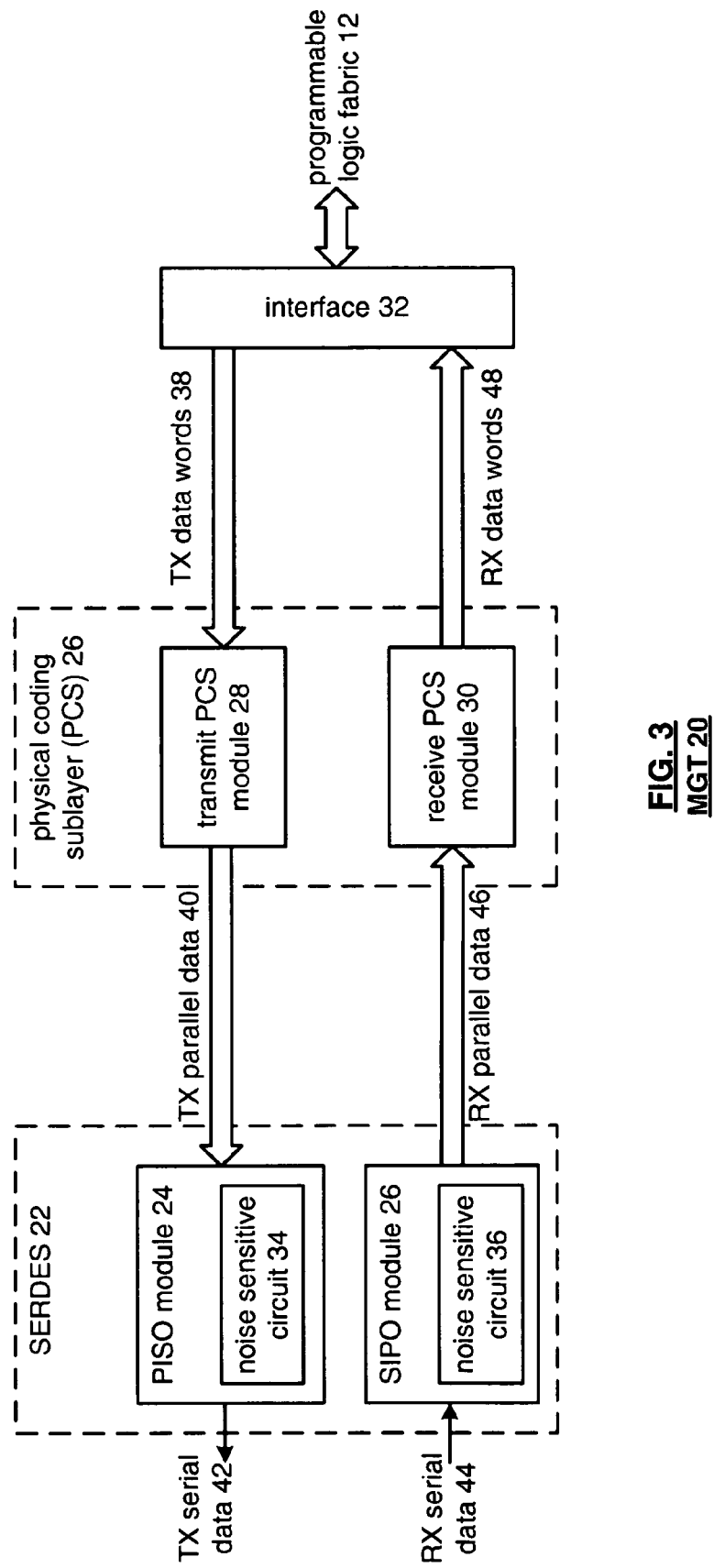
FIG. 3 is a schematic block diagram of a multi-gigabit transceiver in accordance with the present invention.

FIG. 3 is a schematic block diagram of a multi-gigabit transceiver 20 that includes a serializer/de-serializer (SERDES) module 22, a physical coding sub-layer (PCS) module 26 and an interface 32. The SERDES module 22 includes a parallel-in-serial-out module 24 and a serial-in-parallel-out module 26. The parallel-in-serial-out module 24 may include one or more noise sensitive circuits 34. Similarly, serial-in-parallel-out module 26 may include one or more noise sensitive circuits 36. The physical coding sub-layer 26 includes a transmit PCS module 28 and a receive PCS module 30.

The interface 32 provides coupling between the programmable logic fabric 12 and the PCS module 26. For transmitting data, the interface 32 provides transmit data words 38 (e.g., bytes of information formatted in accordance with a particular protocol) from the programmable logic device 12 to the transmit PCS module 28. In general, the transmit PCS module 28 converts the transmit data words 38 (e.g., the bytes of information) into transmit parallel data 40 (e.g., parallel bits of information).

The parallel-in-serial-out module 24 converts the transmit parallel data 40 into transmit serial data 42 (e.g., a serial bit stream). Note that the noise sensitive circuit 34 may be incorporated in high speed analog circuits of the parallel-in-serial-out module 34 including, but not limited to, amplifiers, analog-to-digital converters, buffers, VCO, charge pumps, analog latches, and analog XOR gates, small signal circuits, et cetera.

For received data, the serial-in-parallel-out module 26 converts receive serial data 44 into receive parallel data 46. The receive PCS module 30 converts the received parallel data 46 into received data words 48. The interface 32 provides the received data words 48 to the programmable logic fabric 12.

Protection of the noise sensitive circuits 34 and 36 from substrate coupled noise will be described in greater detail with reference to FIGS. 4-9. The circuitry that generates the noise, which is typically digital circuitry, may be included anywhere within the MGT 20 and/or the field programmable gate array. Such digital circuitry includes, but is not limited, logic gates, digital clocks, digital filters, large signal analog circuits, et cetera.

As one of average skill in the art will appreciate, the MGT 20 may be implemented on an integrated circuit as a stand-alone device or may be implemented on an integrated circuit as part of other devices such as the programmable logic device 10.

Figure 4:
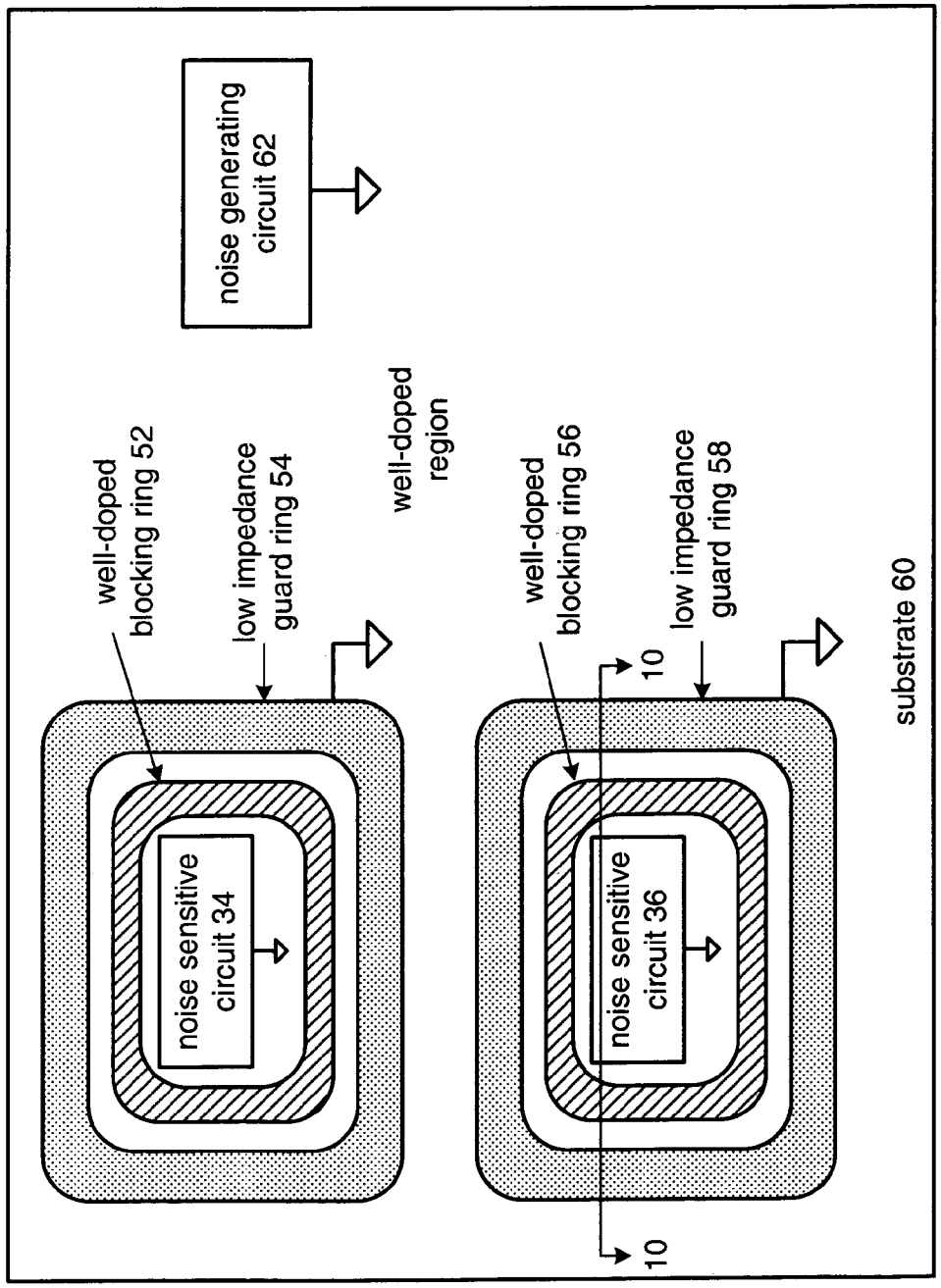
FIG. 4 is a diagram of an integrated circuit in accordance with the present invention.

FIG. 4 is a diagram of an integrated circuit 50 that may support the field programmable gate array, an MGT, a SERDES module and/or any other circuitry that may be fabricated on an integrated circuit. The fabrication process for producing integrated circuit 50 may be done using conventional integrated circuit CMOS fabrication process or other types of integrated circuit fabrication technologies.

Integrated circuit 50 includes a substrate 60, the noise sensitive circuits 34 and 36, a noise generating circuit 62, a 1st well-doped blocking ring 52, a 1st low impedance guard ring 54, a 2nd well-doped blocking ring 56, and a 2nd low impedance guard ring 58. As shown, each of the circuits 34, 36 and 62 have their own ground circuit connections. For example, the noise sensitive circuit 34 may be coupled to one analog ground, the noise sensitive circuit 36 may be coupled to a second analog ground, while the noise generating circuit 62 may be coupled to a separate ground.

As shown, the 1st well-doped blocking ring 52 surrounds the noise sensitive circuit 34, which may include one or more of resistors, traces, transistors, and/or capacitors. The well-doped blocking ring may be a P-well blocking ring or an N-well blocking ring as will be further described with reference to FIGS. 8 and 9, while the cross-sectional view of FIG. 4 taken at lines 10-10 is shown in FIG. 10. The low impedance guard ring 54 encircles the well-doped blocking ring 52 and is coupled to a separate ground connection through a low impedance path. The ground path impedance of the low impedance guard ring 54 is substantially less than impedance of the well-doped blocking ring 52. For example, the low impedance of the ground path of the guard ring 54 may have one-half or less of the impedance of the well-doped blocking ring between the noise sensitive and noise generating circuits, where impedance is a function of resistivity, width, and perimeter. With such an implementation, substrate noise that is produced by the noise generating circuit 62 is shunted to ground via the low impedance guard ring 54 before reaching the noise sensitive circuit 34. As such, the noise sensitive circuit 34 is more immune to the substrate noise produced by the noise generating circuit 62. A similar situation occurs for noise sensitive circuit 36.

As one of average skill in the art will appreciate, the well-doped blocking ring 52 and/or the low impedance guard ring 54 may only partially encircle the noise sensitive circuit 34 to achieve a level of isolation with respect to substrate noise.

Figure 5:
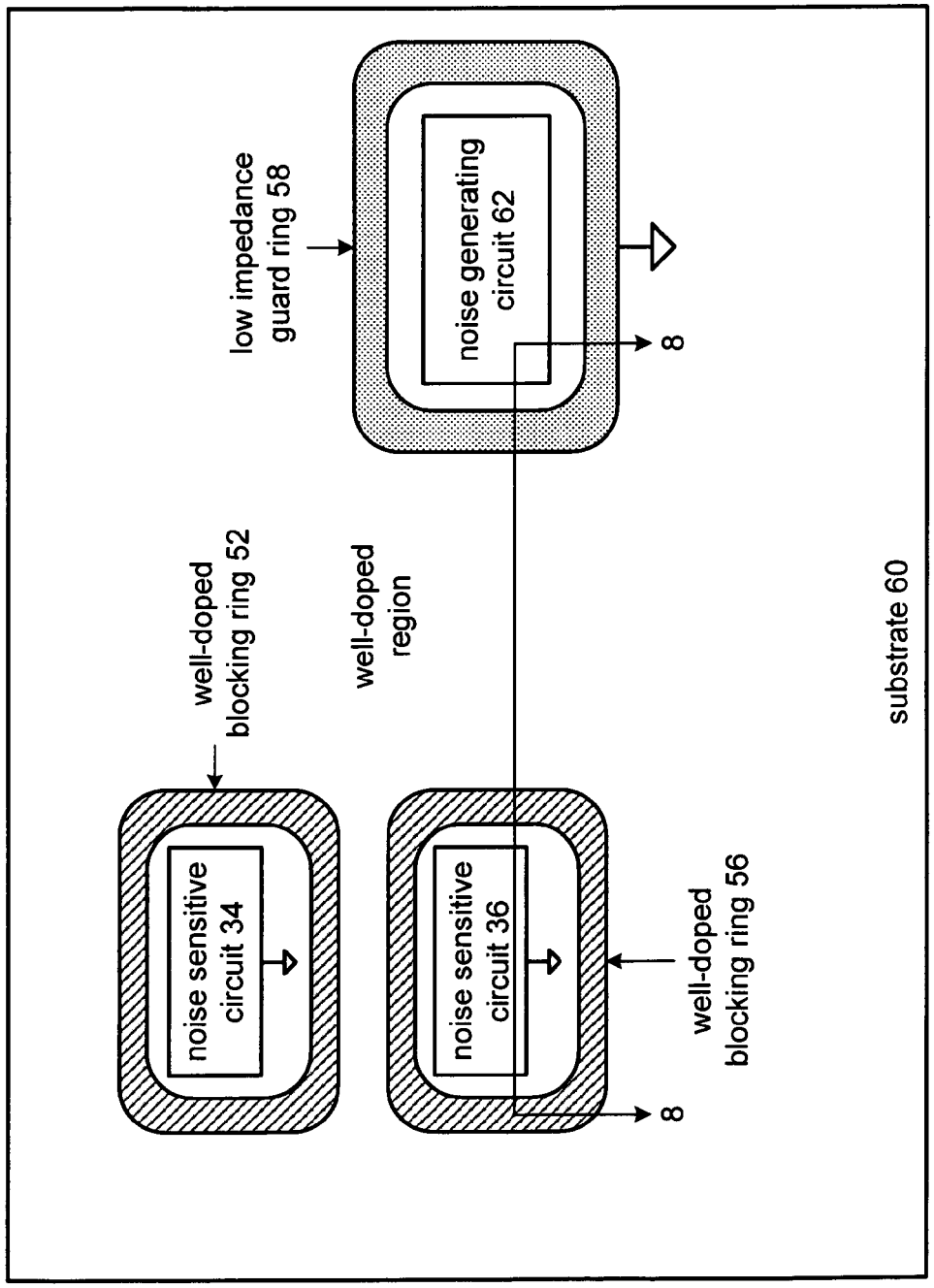
FIG. 5 is a diagram of another embodiment of an integrated circuit in accordance with the present invention.

FIG. 5 is a diagram of another integrated circuit 50 that includes the noise sensitive circuit 34, noise sensitive circuit 36, noise generating circuit 62, well-doped blocking ring 52, well-doped blocking ring 56 and low impedance guard ring 58. In this integrated circuit embodiment, the low impedance guard ring 58 encircles the noise generating circuit 62. As such, substrate noise generated by the noise generating circuit 62 is shunted to ground via the low impedance guard ring 58 before reaching the well-doped blocking rings 56 and 52 which further attenuates substrate noise thereby providing substrate noise immunity to the noise sensitive circuits 34 and 36.

Figure 6:
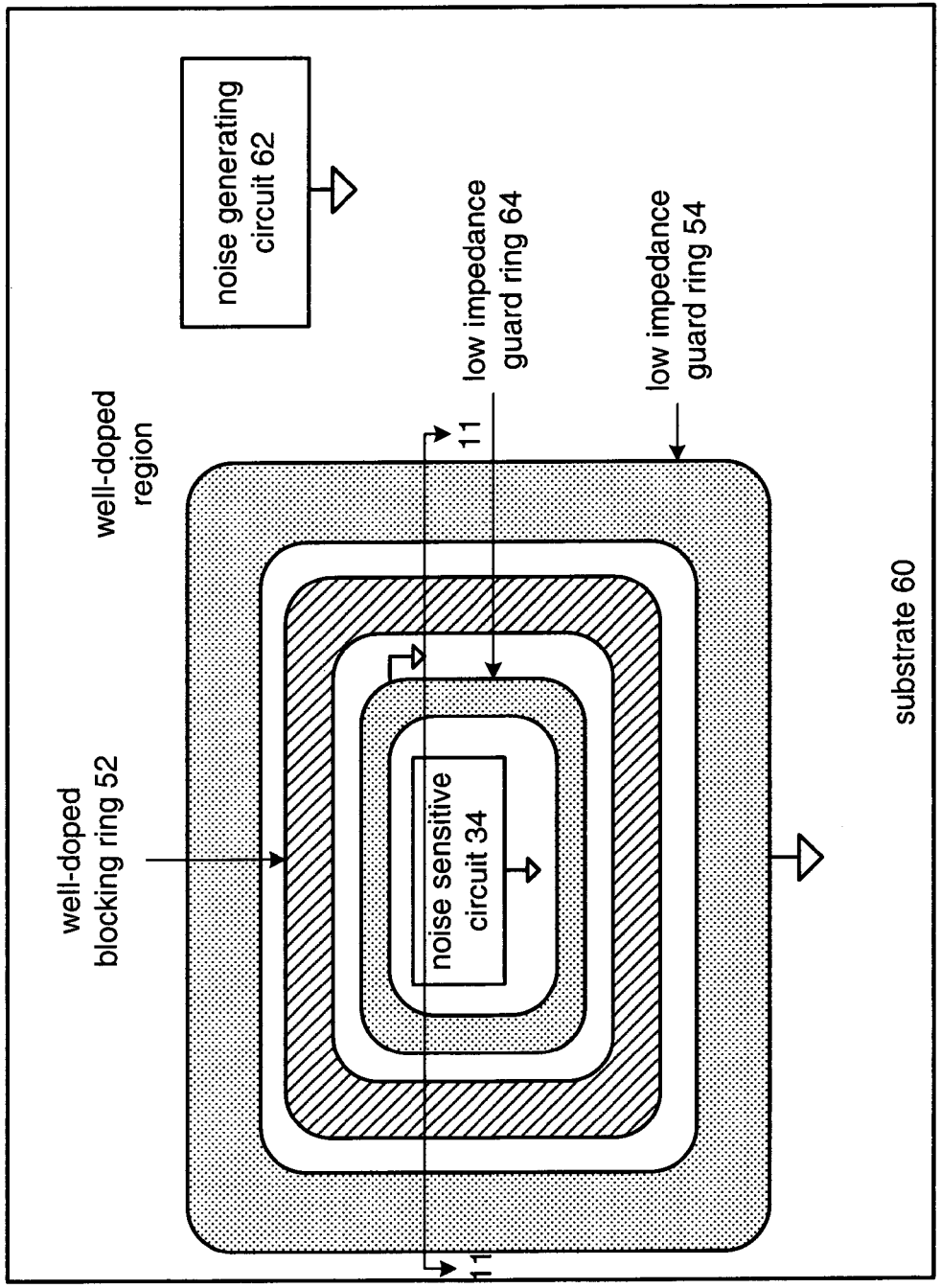
FIG. 6 is a diagram of yet another integrated circuit in accordance with the present invention.
Figure 11:
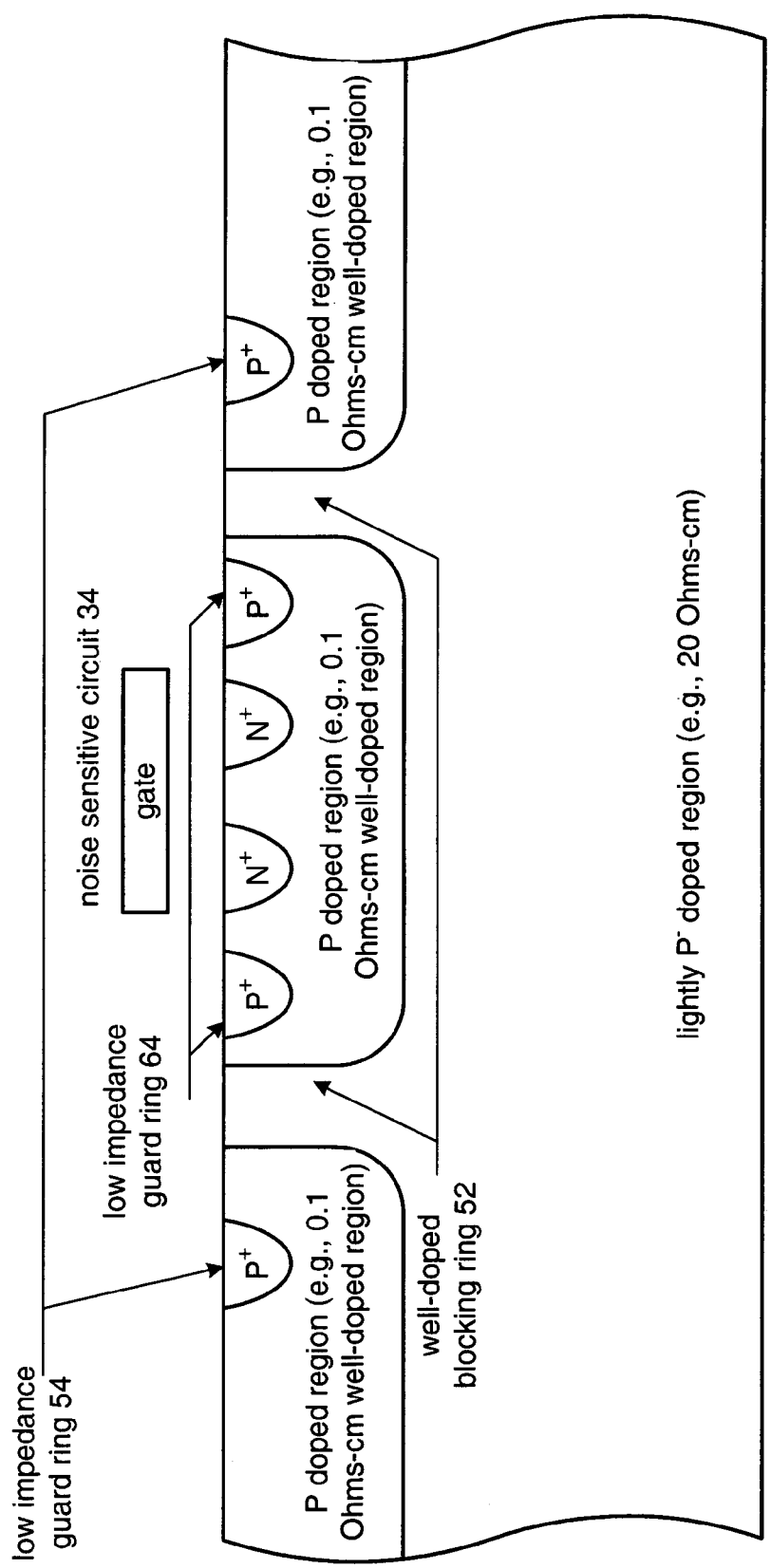
FIG. 11 is a cross-sectional diagram of the integrated circuit of FIG. 6.

FIG. 6 is a diagram of another embodiment of an integrated circuit 50 that includes the noise sensitive circuit 34, a well-doped blocking ring 52, a low impedance guard ring 64 and a low impedance guard ring 54. As shown, each of the circuits 34 and 62 and the guard rings 64 and 54 has separate grounds. In this embodiment, a low impedance guard ring 64 encircles the noise sensitive circuit 34 and is within the well-doped blocking ring 52. Note that the rings 52, 54 and/or 64 may be partial rings, thus not fully encircling the noise sensitive circuit. For example, when the noise sensitive circuit 34 is at an edge of the substrate 60, the rings 52, 54, and/or 64 may only partially surround the circuit 34 or 36. A cross-sectional view of FIG. 6 taken at lines 11-11 is shown in FIG. 11.

Figure 7:
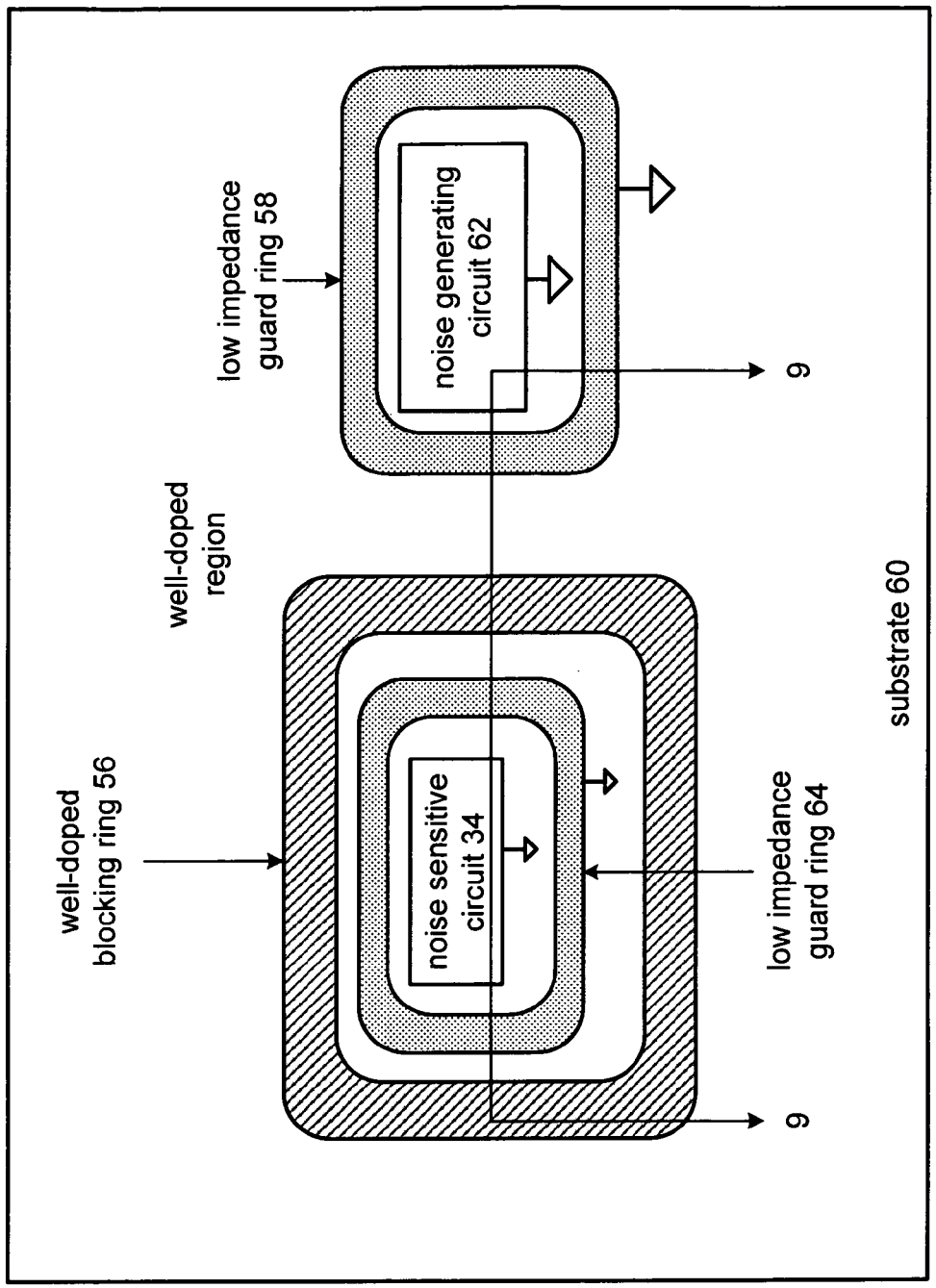
FIG. 7 is a diagram of a further integrated circuit in accordance with the present invention.

FIG. 7 is a diagram of yet another embodiment of integrated circuit 50 that includes the noise sensitive circuit 34, noise generating circuit 62, well-doped blocking ring 56, low impedance guard ring 64, and low impedance guard ring 58. In this embodiment, the low impedance guard ring 58 encircles the noise generating circuit 62, the low impedance guard ring 64 encircles the noise sensitive circuit 34, and the well-doped blocking ring 56 encircles the low impedance guard ring 64. As shown, the noise sensitive circuit 34, noise generating circuit 62 and guard rings 58 and 64 each include their own ground connection. As one of average skill in the art will appreciate, the rings 56, 58 and 64 may be partial rings thus, only partially surrounding the respective circuits 34 and 62. As one of average skill in the art will appreciate, another well-doped blocking ring may be included and encircling the low impedance guard ring 58.

Figure 8:
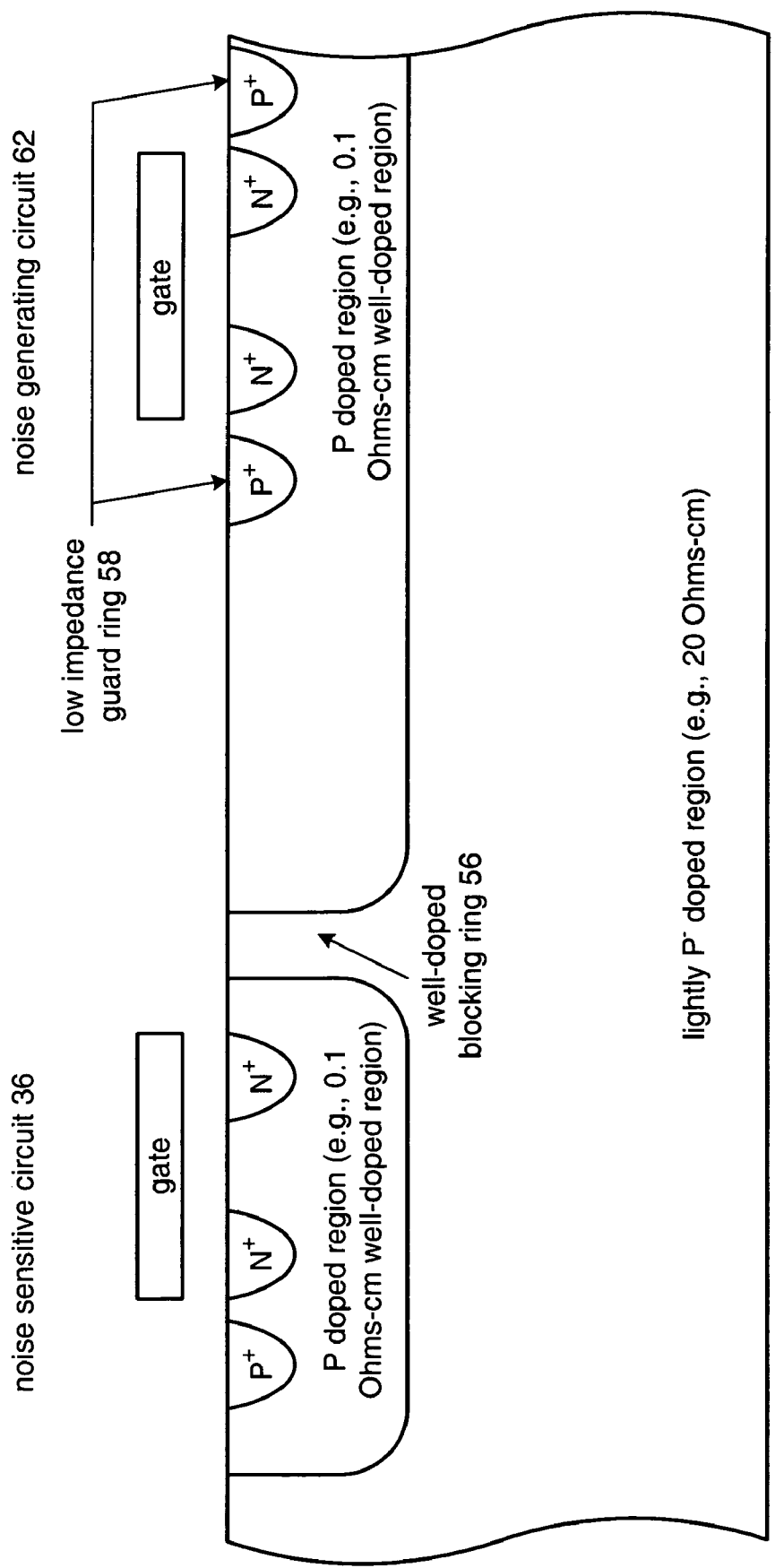
FIG. 8 is a cross-sectional diagram of the integrated circuit of FIG. 5.

FIG. 8 is a cross-sectional diagram of the integrated circuit of FIG. 5. In this example, the noise sensitive circuit is represented by an N-channel transistor as is the noise generating circuit. In this instance, transistor of the noise sensitive circuit 36 includes two N$^+$-doped implants (e.g., drain and source), a gate, and a P$^+$-doped guard ring. The surrounding substrate includes a P-doped region that has a relatively low resistivity, for example, 0.1 to 0.2 OHMS-centimeter.

The transistor of the noise generating circuit 62 includes two N$^+$-doped implants (e.g., drain and source), a gate and a P$^+$-doped encircling guard ring 58. The transistor is fabricated in a P-doped region of the substrate that has a relatively low resistivity (0.1 OHMS-centimeter). The well-doped blocking ring 56 is fabricated utilizing a lightly P$^-$-doped region, which has a relatively high resistivity (e.g., 20 OHMS-centimeter). By having a high impedance substrate region (i.e., the well-doped blocking region 56) surrounding the low impedance guard ring 58, noise generated by the transistor of noise generating circuit 62 will be primarily shunted to ground via the low impedance guard ring 58 and substantially contained within the corresponding P-doped region. As such, very little substrate noise will be coupled to the transistor of the noise sensitive circuit 36.

Figure 9:
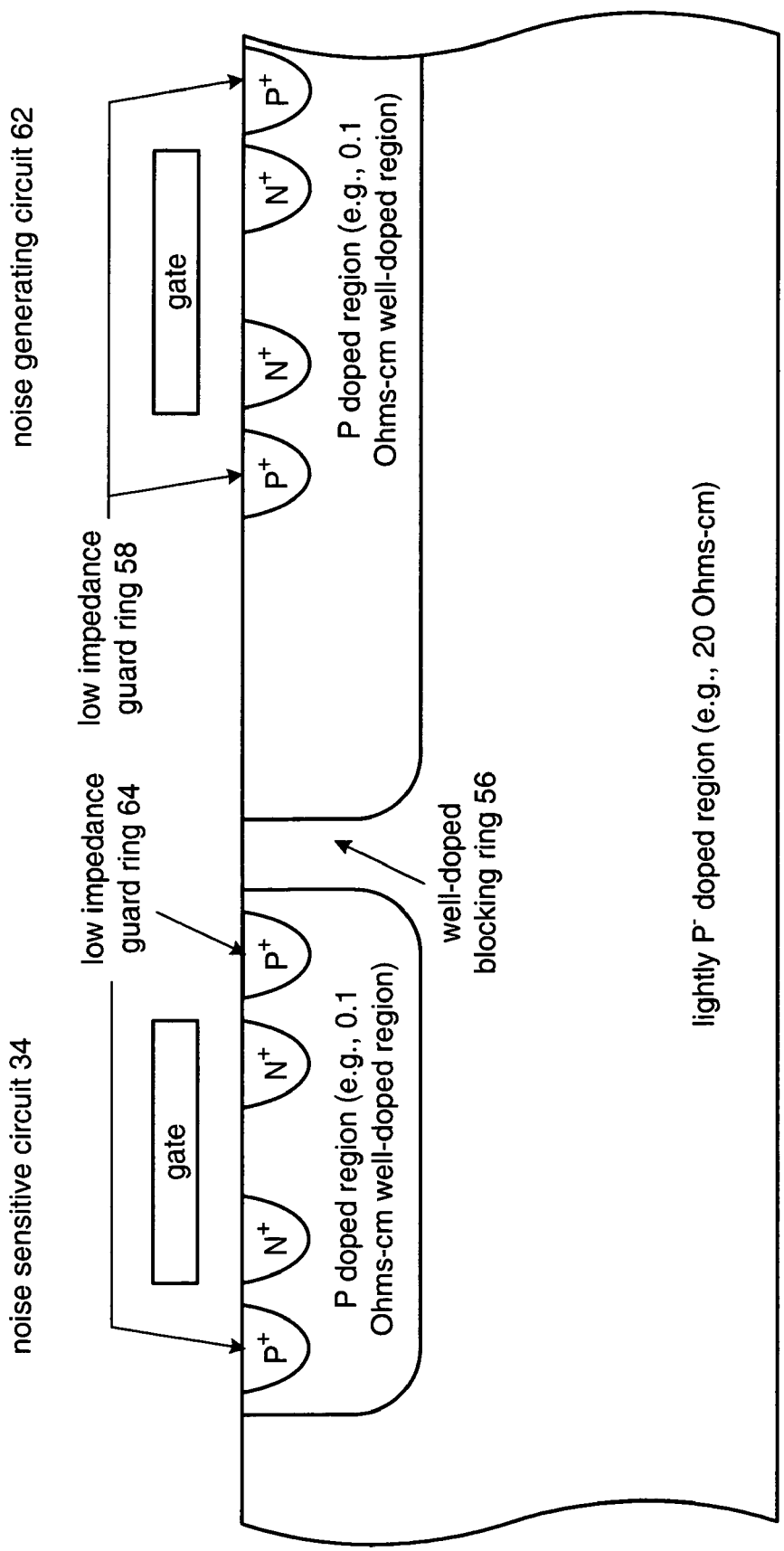
FIG. 9 is a cross-sectional diagram of the integrated circuit of FIG. 7.
Figure 10:
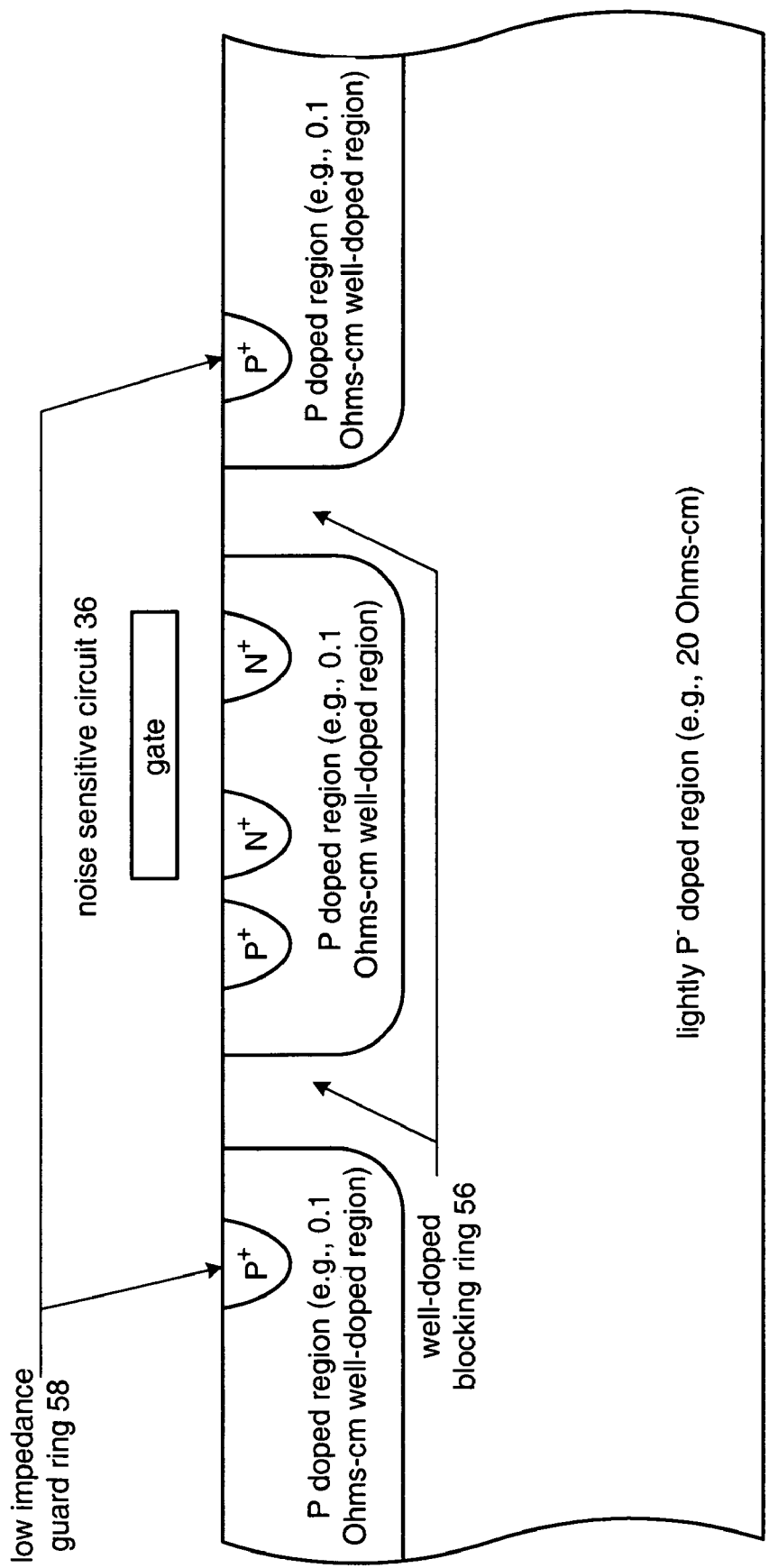
FIG. 10 is a cross-sectional diagram of the integrated circuit of FIG. 4.

FIG. 9 is a cross-sectional diagram of the integrated circuit of FIG. 7. This diagram differs from FIG. 8 in that the transistor of the noise sensitive circuit 34 is encircled by its own low impedance guard ring 64. In this embodiment, any substrate noise that is not shunted to ground via the low impedance guard ring 58 and that is coupled through the well-doped blocking ring will be shunted to ground via the low impedance guard ring 64.

As one of average skill in the art will appreciate, the concepts provided with respect to FIGS. 2-9 may be equally applicable for P-channel transistors as well as for other integrated circuit fabrication processes.

As one of average skill in the art will appreciate, the term "substantially" or "approximately", as may be used herein, provides an industry-accepted tolerance to its corresponding term and/or relativity between items. Such an industry-accepted tolerance ranges from less than one percent to twenty percent and corresponds to, but is not limited to, component values, integrated circuit process variations, temperature variations, rise and fall times, and/or thermal noise. Such relativity between items ranges from a difference of a few percent to magnitude differences. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a technique for isolating substrate noise thereby improving overall performance of integrated circuits. As one of average skill in the art will appreciate, other embodiments may be derived from the teaching of the present invention without deviating from the scope of the claims.

What is claimed is:

1. An integrated circuit comprises:
    a substrate having a first resistivity, the substrate including a blocking ring having the first resistivity and a portion positioned between a first region and a second region, the first region and the second region each comprising a well having a second resistivity, which is lower than the first resistivity, and having circuit elements;
    a noise sensitive circuit comprising circuit elements of the first region of the substrate comprising a well, wherein the blocking ring at least partially surrounds the noise sensitive circuit; and
    a first low impedance guard ring comprising an implant region formed in the substrate to at least partially surround the blocking ring, wherein the first low impedance guard ring is operably coupled to a first circuit ground, wherein impedance of the first low impedance guard ring is substantially less than impedance of the blocking ring.

2. The integrated circuit of claim 1 further comprises:
    a second low impedance guard ring comprising an implant region formed in the substrate between the blocking ring and the noise sensitive circuit, wherein the second low impedance guard ring at least partially surrounds the noise sensitive circuit, and wherein the second low impedance guard ring is operably coupled to a second circuit ground.

3. The integrated circuit of claim 1 comprises:
    the noise sensitive circuit operably coupled to a second circuit ground.

4. The integrated circuit of claim 1, wherein the blocking ring comprises at least one of:
   a blocking ring surrounding a p-well; and
   a blocking ring surrounding an n-well.

5. The integrated circuit of claim 1, wherein the noise sensitive circuit comprises at least one of:
   a transistor, a trace, a capacitor, and a resistor.

6. The integrated circuit of claim 1 comprises:
   a second noise sensitive circuit formed in a third region comprising a well having the second resistivity and having circuit elements formed in the substrate, wherein a second blocking ring formed in the substrate at least partially surrounds the second noise sensitive circuit; and
   a second low impedance guard ring comprising an implant region formed in the substrate to at least partially surround the second blocking ring, wherein the second low impedance guard ring is operably coupled to a second circuit ground, wherein impedance of the second low impedance guard ring is substantially less than impedance of the second blocking ring.

7. The integrated circuit of claim 1 wherein the second region comprising a well comprises a noise generating circuit fabricated on the substrate; and
   wherein the integrated circuit further comprises a second low impedance guard ring comprising an implant region formed in the substrate to at least partially surround the noise generating circuit, wherein the second low impedance guard ring is operably coupled to a second ground and wherein impedance of the second low impedance guard ring is substantially less than impedance of the blocking ring.

8. The integrated circuit of claim 7 comprises:
   a second blocking ring formed in the substrate to at least partially surround the noise generating circuit, wherein impedance of the second blocking ring is substantially greater than impedance of the second low impedance guard ring.

9. The integrated circuit of claim 6 further comprises:
   a Serial-Input-Parallel-Output (SIPO) module operably coupled to convert inbound high-speed serial data into inbound parallel data, wherein the SIPO module is fabricated on the substrate; and
   a Parallel-Input-Serial-Output (PISO) module operably coupled to convert outbound parallel data into high-speed outbound serial data, wherein the PISO module is
   wherein the noise sensitive circuit is part of the SIPO module; and
   wherein the second noise sensitive circuit is part of the PISO module.

10. The integrated circuit of claim 9 comprises:
    a third low impedance guard ring comprising an implant region formed in the substrate to at least partially surround a first noise generating circuit of the SIPO module, wherein the third low impedance guard ring is operably coupled to a third ground and wherein impedance of the third low impedance guard ring is substantially less than impedance of the blocking ring; and
    a fourth low impedance guard ring comprising an implant region formed in the substrate to at least partially surround a second noise generating circuit of the PISO module, wherein the fourth low impedance guard ring is operably coupled to a fourth ground and wherein impedance of the fourth low impedance guard ring is substantially less than impedance of the second blocking ring.

11. The integrated circuit of claim 10, wherein each of the first and second noise generating circuits comprises at least one of:
    a clock circuit; and
    digital circuitry.

12. The integrated circuit of claim 10, wherein the blocking ring comprises at least one of:
    a blocking ring surrounding a p-well; and
    a blocking ring surrounding an n-well.

13. The integrated circuit of claim 10, wherein each of the first and second noise sensitive circuits comprises at least one of:
    a transistor, a trace, a capacitor, and a resistor.

14. The integrated circuit of claim 1, wherein the integrated circuit is a field programmable gate array (FPGA), the integrated circuit further comprises:
    programmable logic fabric fabricated on the substrate; and
    a multi-gigabit transceiver (MGT) for transmitting and receiving high-speed data, wherein the MGT is fabricated on the substrate;
    wherein the MGT includes the noise sensitive circuit.

15. The integrated circuit of claim 14 further comprises:
    a second blocking ring formed in the substrate to at least partially surround noise generating circuitry of the programmable logic fabric; and
    a second low impedance guard ring comprising an implant region formed in the substrate to at least be partially surrounded by the second blocking ring, wherein the second low impedance ring is operably coupled to a second circuit ground and wherein an impedance of the second low impedance guard ring is substantially less than the impedance of the second blocking ring.

16. The integrated circuit of claim 15, wherein the noise generating circuitry comprises at least one of:
    a clock circuit; and
    digital circuitry.

17. The integrated circuit of claim 14, wherein the noise sensitive circuit comprises at least one of:
    a trace, a capacitor, a transistor, and a resistor.

18. The integrated circuit of claim 14 comprises:
    the noise sensitive circuit operably coupled to a second circuit ground.

19. The integrated circuit of claim 14, wherein the blocking ring comprises at least one of:
    a blocking ring surrounding a p-well; and
    a blocking ring surrounding an n-well.

20. The integrated circuit of claim 14 further comprises:
    a digital clock manager (DCM) for generating at least one clock signal, wherein the DCM is fabricated on the substrate;
    a second blocking ring formed in the substrate to at least partially surround noise generating circuitry of at least one of the programmable logic fabric and the DCM; and
    a second low impedance guard ring comprising an implant region formed in the substrate to at least be partially surrounded by the second blocking ring, wherein the second low impedance ring is operably coupled to a second circuit ground and wherein an impedance of the second low impedance guard ring is substantially less than the impedance of the second blocking ring.

* * * * *